United States Patent [19]
Betker et al.

[11] Patent Number: 5,833,473
[45] Date of Patent: Nov. 10, 1998

[54] CARDBUS BRIDGE

[75] Inventors: Jay Brian Betker, Yorba Linda; Anthony John Knights, Irvine, both of Calif.

[73] Assignee: ITT Manufacturing Enterprises, Inc., Wilmington, Del.

[21] Appl. No.: 815,768

[22] Filed: Mar. 12, 1997

[51] Int. Cl.$^6$ ....................................................... H01R 9/09
[52] U.S. Cl. ........................ 439/76.1; 439/946; 361/800
[58] Field of Search ................................. 439/76.1, 946; 361/753, 799, 800, 816

[56] References Cited

U.S. PATENT DOCUMENTS

| | | | |
|---|---|---|---|
| 5,207,586 | 5/1993 | MacGregor et al. | 439/76.1 |
| 5,242,310 | 9/1993 | Leung | 439/76 |
| 5,288,237 | 2/1994 | Mizutani et al. | 439/76 |
| 5,319,516 | 6/1994 | Perkins | 361/220 |
| 5,413,490 | 5/1995 | Tan et al. | 439/76 |
| 5,457,606 | 10/1995 | Young et al. | 361/737 |
| 5,476,387 | 12/1995 | Ramey et al. | 439/76.1 |
| 5,478,260 | 12/1995 | Kaufman et al. | 439/108 |
| 5,513,074 | 4/1996 | Ainsbury et al. | 361/737 |
| 5,519,577 | 5/1996 | Dudas et al. | 361/737 |
| 5,536,905 | 7/1996 | Redman et al. | 174/35 |
| 5,548,483 | 8/1996 | Feldman | 361/737 |
| 5,572,408 | 11/1996 | Anhalt et al. | 361/737 |
| 5,581,127 | 12/1996 | Shinohara | 257/679 |
| 5,586,893 | 12/1996 | Mosquera | 439/108 |

*Primary Examiner*—Neil Abrams
*Assistant Examiner*—T. C. Patel
*Attorney, Agent, or Firm*—Freilich Hornbaker Rosen

[57] ABSTRACT

An IC card is provided, of the type that has a cardbus shield (30) with a shield plate (132) mounted on the top of a front connector (12) and with shield tails (36) extending rearwardly and downwardly to secondary ground traces (50) on a circuit board (34), wherein the IC card includes a dielectric cardbus bridge with a crosspiece (100). The crosspiece supports the middle (104) of the front end (102) of the sheet metal top cover so it is held securely out of contact with the cardbus shield but lies above at least portions of the contact tails (130) that extend from the rear of the front connector to signal traces on the circuit board. The crosspiece is supported to lie over the circuit board closely behind the rear end (136) of the shield plate, with the crosspiece having a top cover support surface (112) on which the front end of the cover middle lies. The bridge has slots (110) that pass the shield tails and has an upward projection (152) at its front end that forms a rearwardly-facing shoulder (116) to abut the front edge of the middle of the top cover. The cardbus bridge has laterally opposite sides forming mounts (72, 74) that are each fixed to a corresponding side of the circuit board and to the corresponding side of the front connector housing to hold these parts together and to support the top and bottom sheet metal cover parts (52, 54).

12 Claims, 5 Drawing Sheets

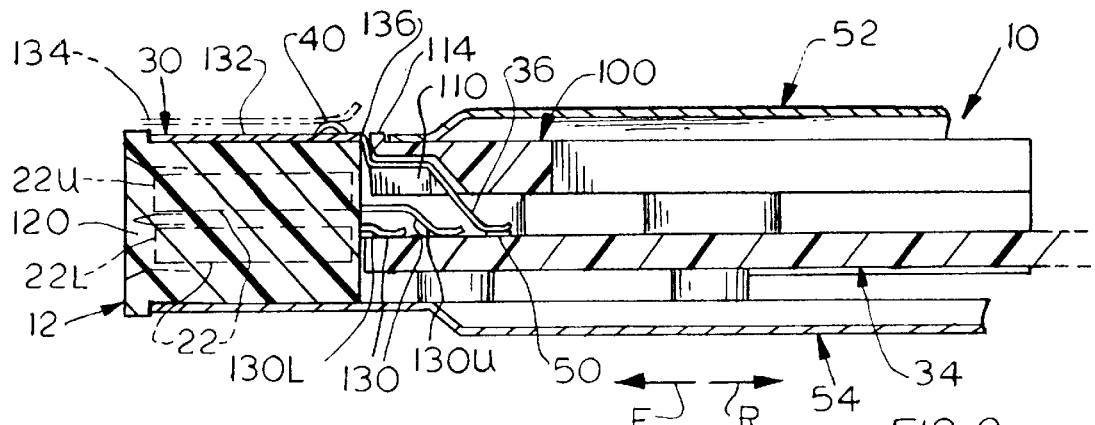
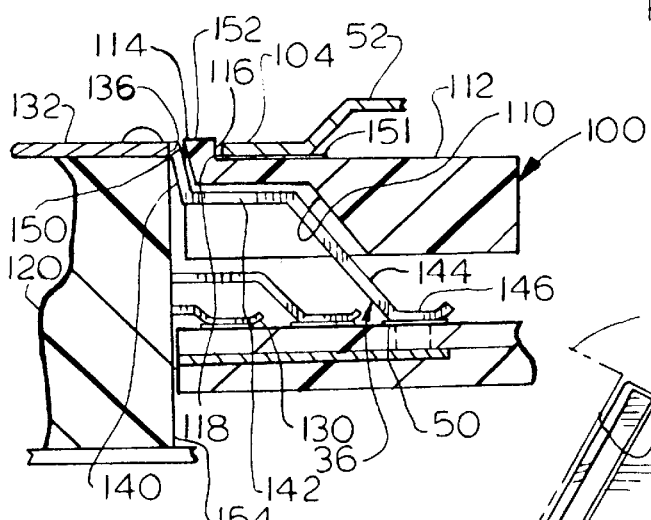
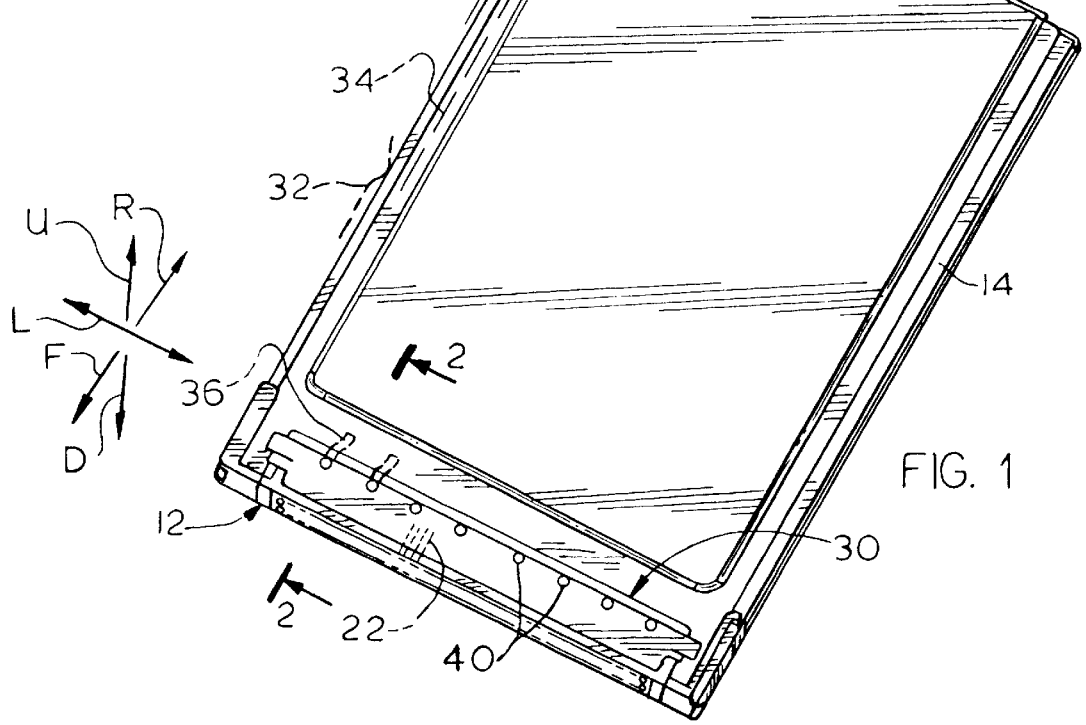

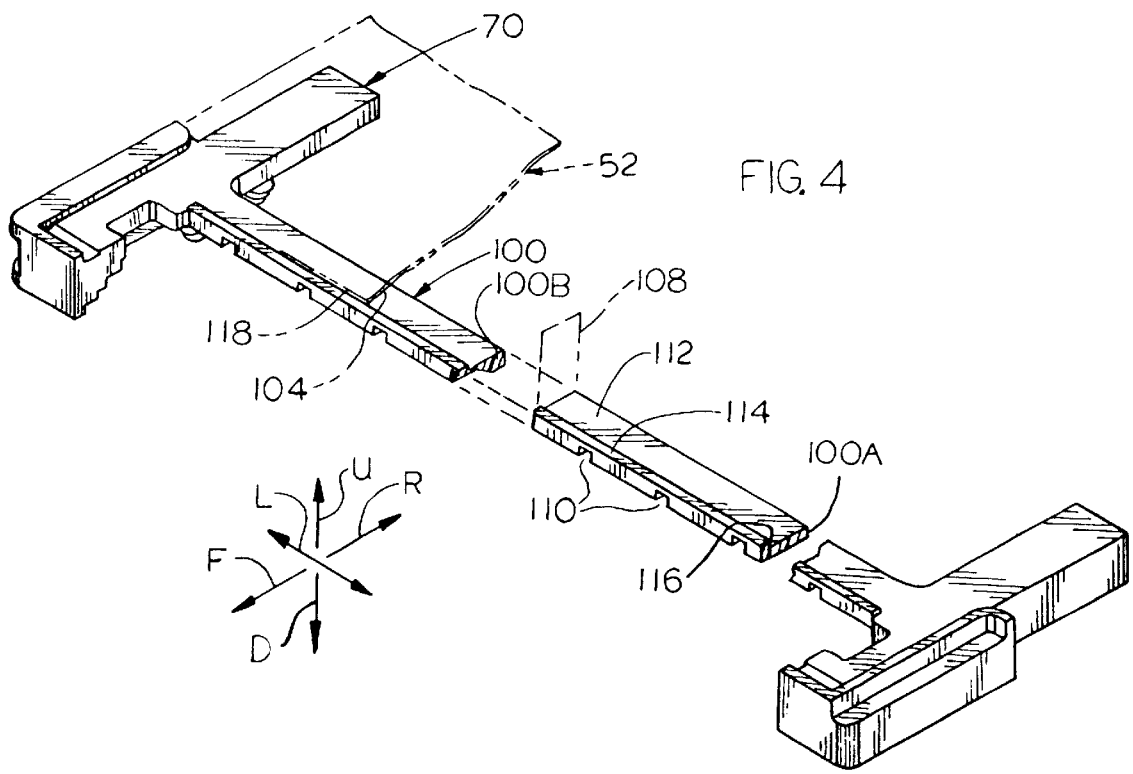
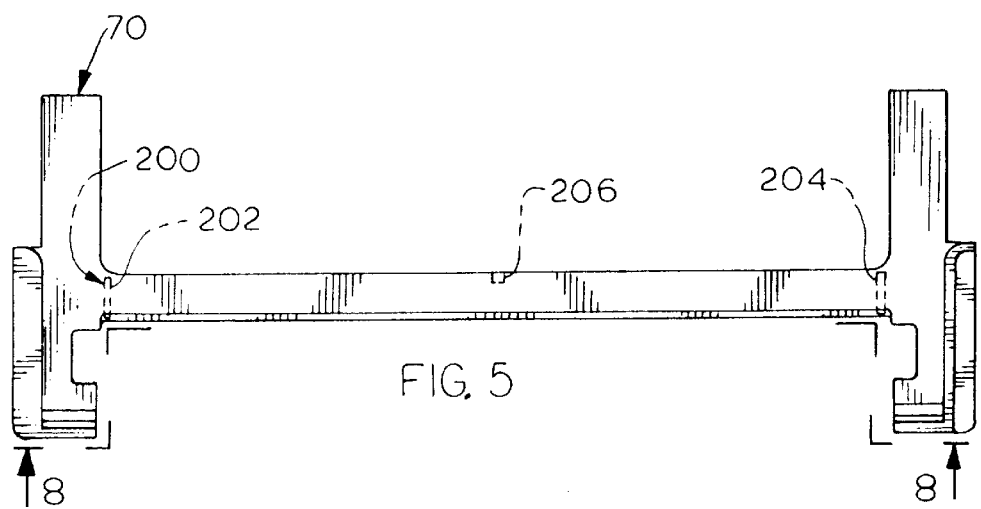

CARDBUS BRIDGE

BACKGROUND OF THE INVENTION

IC cards constructed in accordance with PCMCIA (Personal Computer Memory Card International Association) standards, each have a width of 54 mm and a length of 85.6 mm, with the thickness varying for different types of cards. Type II cards, which have a maximum thickness of 5 mm, have been the most popular. Most IC cards include a 68 contact front connector whose contacts have tails connected to traces at the front of a circuit board, with the circuit board largely enclosed by a sheet metal cover. The sheet metal cover provides a shield to prevent the passage of electromagnetic energy into or out of the card, with the cover connected to a primary ground in the host that receives the IC card, and usually also to a primary ground of the IC card circuit board.

Previously, signals were transmitted through the front connector contacts, between the host and the IC card, in bytes that each included 16 bits, at a maximum frequency of about 16 MHz. Recently, information has been transmitted in 32-bit bytes, requiring a maximum transmission frequency of about 33 MHz through the front connector contacts. To avoid signal degradation, such as crosstalk between closely spaced contacts, the industry has approved the use of a cardbus shield. The cardbus shield includes a metal plate lying at the top of the front connector and connectable to a host secondary ground and to a secondary ground of the IC card circuit board. The secondary ground is usually of the same nominal potential as the primary ground, but is isolated therefrom, so that, for example, any signals picked up by the large area sheet metal card cover are not coupled to the signal contacts of the front connector.

An industry PCMCIA approved cardbus shield includes a shield plate fixed to the top of the front connector and having several bumps for engaging a host secondary ground contact. The cardbus shield also has several tails extending from the rear of the shield plate to secondary ground traces on the circuit board. The sheet metal card cover must not touch the cardbus shield. As a result, an important problem is how to mount the sheet metal top cover of the IC card, whose front end previously was supported on the top of the front connector. One solution would be to have the middle of the top cover front end lie unsupported immediately behind the rear of the cardbus shield plate. However, such unsupported middle of the top cover front end, would weaken the IC card and leave a gap through which dirt might enter. Another solution is to mount the front end of the top cover middle directly on the cardbus shield plate, with a thin strip of insulation between them. However, this would hamper contact between bumps on the cardbus shield plate and a secondary ground contact on the host. Apparatus that facilitated the use of a cardbus shield while providing good support for the front end of the top cover middle, and while positioning the front edge of the top cover middle close to the rear of the cardbus shield plate so there was a minimal gap therebetween through which EMI (electromagnetic interference) could pass, would be of value.

SUMMARY OF THE INVENTION

In accordance with one embodiment of the present invention, apparatus is provided for use with an IC card that has a cardbus shield, to support the sheet metal top cover part at the middle of its front end. The apparatus comprises a dielectric cardbus bridge having a crosspiece. The crosspiece lies closely behind the rear edge of the cardbus shield plate, and lies over at least part of the tails of the front connector and over the shield tails. The crosspiece has an upper surface that supports the middle front end of the sheet metal top cover part, so the cover part front end lies only a small distance behind the shield plate and is supported against downward deflection and front-rear shifts.

The crosspiece can have an upward projection with a generally rearwardly-facing shoulder to abut the front edge of the top cover. The crosspiece can have a plurality of slots in its lower end for passing the shield tails. Laterally opposite sides of the cardbus bridge can form mounts that are fixed to opposite sides of the front connector and that are fixed to opposite sides of the circuit board front end to tie them together, and that support the front ends of the sheet metal top and bottom cover parts.

The novel features of the invention are set forth with particularity in the appended claims. The invention will be best understood from the following description when read in conjunction with the accompanying drawings.

BRIEF DESCRIPTION OF THE DRAWINGS

FIG. 1 is a top and front isometric view of an IC card constructed in accordance with the present invention.

FIG. 2 is a view taken on line 2—2 of FIG. 1.

FIG. 2A is an enlarged view of a portion of FIG. 2.

FIG. 4 is a top and front isometric view of the cardbus bridge of the IC card of FIG. 3.

FIG. 5 is a plan view of the cardbus bridge of FIG. 4, and also showing in phantom lines, a cardbus bridge of another embodiment of the invention.

DESCRIPTION OF THE PREFERRED EMBODIMENTS

Figure 3:
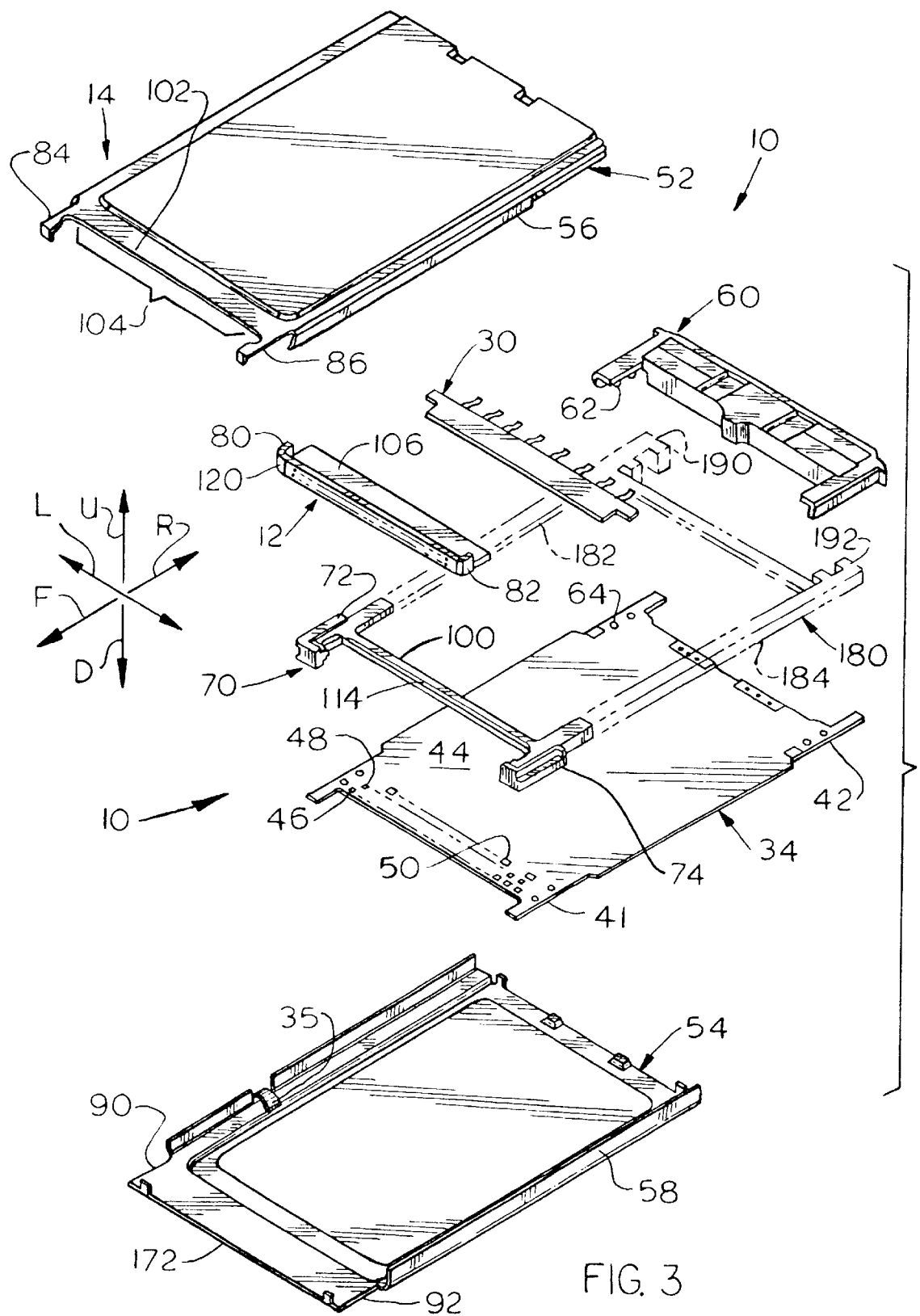
FIG. 3 is an exploded view of the IC card of FIG. 1.
Figure 6:
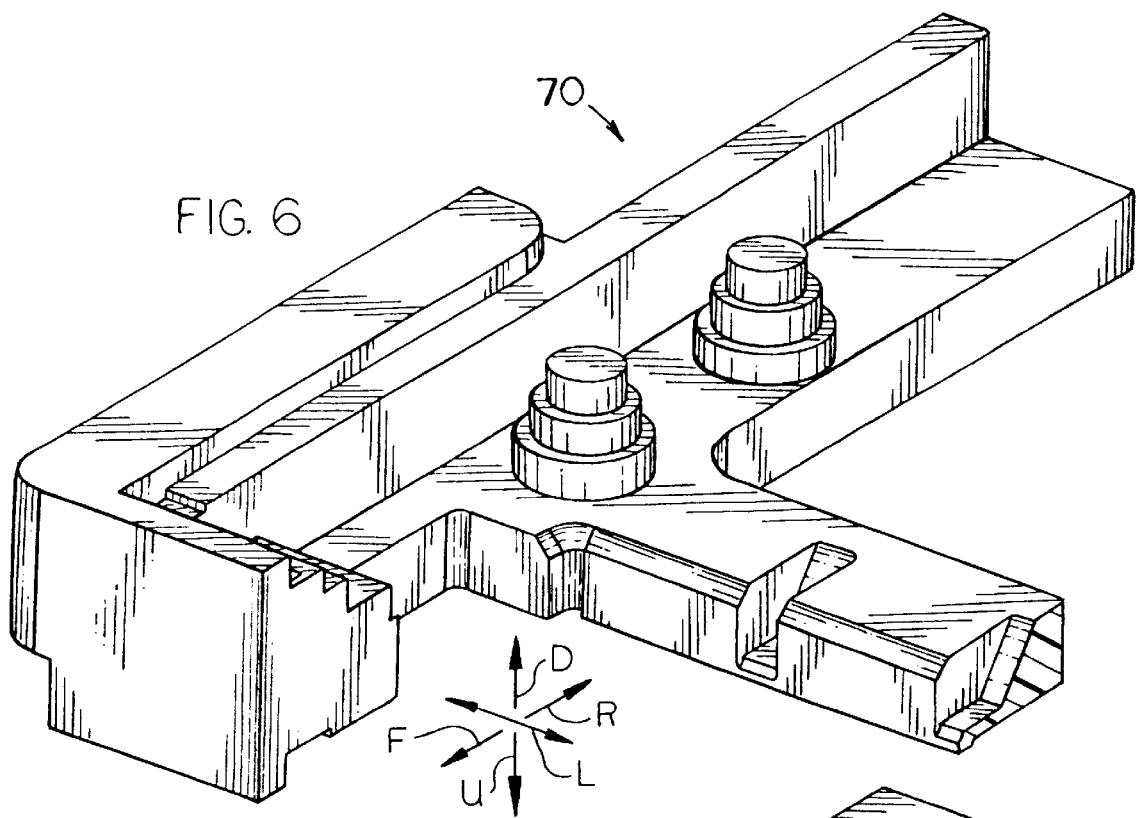
FIG. 6 is a bottom and front isometric view of a portion of the cardbus bridge of FIG. 4.

FIG. 1 illustrates an IC card 10 which includes a front connector 12 having 68 contacts, with most of them being used to transmit signals and all herein designated as signal contacts. A large area sheet metal cover 14 lies above and below most of a circuit board 34, to protect the inside of the card from EMI (electromagnetic interference). The card is used by inserting it in a forward direction F into a slot 16 of a host 20, until pin contacts of the host, which lie at the front end of the slot, are received in socket contacts 22 of the front connector 12. Recently, in order to transmit data at a higher rate through signal contacts of the front connector 12, a cardbus shield 30 has been added. The cardbus shield 30 is fixed to the top of the front connector 12 so the shield lies closely above the contacts 22 of the front connector. While the large area sheet metal cover 14 is connected to a primary ground of the host, as through a side terminal 32 of the host, and is usually connected to a ground on the circuit board 34 of the card (as through tab 35 in FIG. 3), the cardbus shield 30 is connected to a separate secondary ground. The cardbus shield has shield tails 36 that connect to a secondary ground of the circuit board, and has contact locations in the form of bumps 40 that can engage one or more secondary ground contacts of the host. Separate primary and secondary grounds are useful, for example, to assure that any EMI picked up by the large area sheet metal cover 14 are not transmitted to the signal contacts 22 of the front connector.

FIG. 3 shows the different parts of the IC card 10. The circuit board 34 has front and rear end portions 41, 42. An upper surface 44 of the circuit board has, at its front end portion, first and second rows 46, 48 of signal traces, and a row of secondary ground traces 50. It should be noted that a limited number of traces of the rows 46, 48 may carry a ground potential or considerable current for powering circuitry, but most of the signal traces carry high frequency signals such as those representing digital bits. FIG. 3 shows the front connector 12 and the cardbus shield 30 separated from each other. The large area sheet metal cover 14 includes top and bottom sheet metal cover parts 52, 54 that have side rails 56, 58 where they are joined. A rear connector assembly 60 has contacts (not shown) for connecting to a cable that may extend to an accessory such as a facsimile machine. The rear connector assembly 60 also attaches to the rear end portion 42 of the circuit board by pegs 62 projecting into holes 64 in the board. The rear connector assembly 60 also supports the rear ends of the top and bottom sheet metal cover parts.

The IC card includes a cardbus bridge 70 with laterally opposite sides that form mounts 72, 74. Each mount is fixed to a corresponding side of the front end portion 41 of the circuit board, and to a corresponding side 80, 82 of the front connector 12. Each mount also supports a corresponding side 84, 86 of the top cover part and a corresponding side 90, 92 of the bottom cover part 54. The cardbus bridge 70 also has a crosspiece 100.

The sheet metal top cover part 52 has a front end portion 102 with a lateral middle 104 which lies between the opposite sides 84, 86. Previously, as in the IC card described in U.S. Pat. No. 5,563,771, the front lateral middle 104 was directly supported on a front connector assembly. However, in the present high speed IC card, the cardbus shield 30 lies on the top 106 of the front connector 12, and the top cover part 52 must be electrically isolated from the shield. In the present invention, the front lateral middle 104 is supported on the crosspiece 100 of the cardbus bridge. The crosspiece 100 supports the front lateral middle 104 of the top cover part so it lies out of direct contact with the cardbus shield 30, and yet there is only a small gap between them, through which EMI could pass into the inside of the IC card.

It is noted that while a "standard" cardbus shield 30 lies on top of the front connector housing, it would be possible to mount a plate-like shield at the bottom of the front connector, or to even mold it to lie between the upper and lower signal contacts.

FIG. 4 illustrates some details of the cardbus bridge 70 and of its crosspiece 100. The crosspiece 100 is elongated in a lateral direction L and is symmetrical about a vertical plane 108. Along most of its lateral length, the crosspiece has the cross-section shown at 100A. However, the crosspiece has several slots 110 in its lower face, with a cross-section shown at 100B at each slot. The slots are used to pass shield tails of the cardbus shield. The crosspiece has a support surface 112 which supports the front lateral middle 104 of the top shield part 52. The crosspiece also has an upward projection 114 at its front end, which forms a largely rearwardly-facing shoulder 116, for abutting the extreme front edge 118 of the top cover middle. The front of the cover middle part lies substantially against the shoulder (within one mm of the shoulder).

FIGS. 2 and 2A shows details of the front portion of the IC card, including the front connector 12, the circuit board 34, the top and bottom cover parts 52, 54, the cardbus shield 30, and the crosspiece 100 of the cardbus bridge. The socket contacts 22 lying within the dielectric connector housing 120 of the front connector, include lower and upper contacts 22L, 22U. The lower and upper contacts have largely rearwardly-extending tails 130L and 130U that engage corresponding signal traces on the circuit board. The cardbus shield 30 includes a shield plate 132 which forms the bumps 40 that engage a secondary grounding contact such as indicated at 134, of the host. The bumps 40 each projects about 0.5 mm above the surrounding upper surface of the shield plate.

Each of the shield tails 36 extends from the rear edge 136 of the shield plate. As indicated in FIG. 2A, each shield tail 36 has a forward part 140 that extends at a steep angle to the horizontal and generally primarily vertically, a second part 142 that extends horizontally, a third part 144 that extends at a downward-rearward incline, and a rear end 146 that is lowermost and that is soldered to a secondary ground trace 50 of the circuit board. Applicant positions the crosspiece 100 so its front edge 150 lies closely behind the rear end 136 of the shield plate, and so the crosspiece holds the extreme front edge 118 of the top cover front middle closely behind the rear end 136 of the shield plate. As a result, the front portion 152 of the crosspiece (which is shown formed by projection 114), which lies between the front edge 118 of the top cover and the rear end 136 of the shield plate, serves to occupy most of the gap between the shield plate 132 and the top cover 52, to keep out dirt. The front edge 118 of the top cover lies close enough to the shield plate 132 that it lies directly over at least portions of the signal contact tails 130 (at least tails 130U and preferably also 130L, when the circuit board lies in a horizontal plane) to help shield them from EMI. It is possible to apply a sealant to seal the gap between shield plate rear edge 136 and crosspiece front edge 150.

In one IC card with a crossbus bridge of the illustrated construction, that applicants have designed, the lower signal contacts 130L extended 1.3 mm rearward of the rear surface 154 of the connector housing 120. The upper signal contacts 130U extended 2.6 mm rearward of the housing. The cardbus shield was mounted as illustrated, with its shield tails extending 4.2 mm rearward of the housing surface. The front edge 150 of the crosspiece lay 0.5 mm rearward of the shield plate rear edge 136 and of the connector housing rear surface 154. The shoulder 116 on the upward projection lay 1.0 mm rearward of the housing rear surface 154.

As shown in FIG. 2A, applicant prefers to provide a strip of contact adhesive 151 between the top cover middle 104 and the crosspiece surface 112. It is possible to eliminate the upward projection 114, although the upward projection helps to prevent direct contact between the cardbus shield 132 and the top cover 52 if the top cover should be shifted forwardly. The slots 110 in the bottom of the crosspiece enable the crosspiece to be thicker everywhere except at the slots, to provide a crosspiece that better resists beam bending. Since there are only eight shield tails 36 and corresponding slots 110, the crosspiece has a considerable height of material at its front, between adjacent slots. The signal contact tails 130 are much more closely spaced, and applicant does not try to provide slots in the crosspiece to receive them (although he could).

Figure 7:
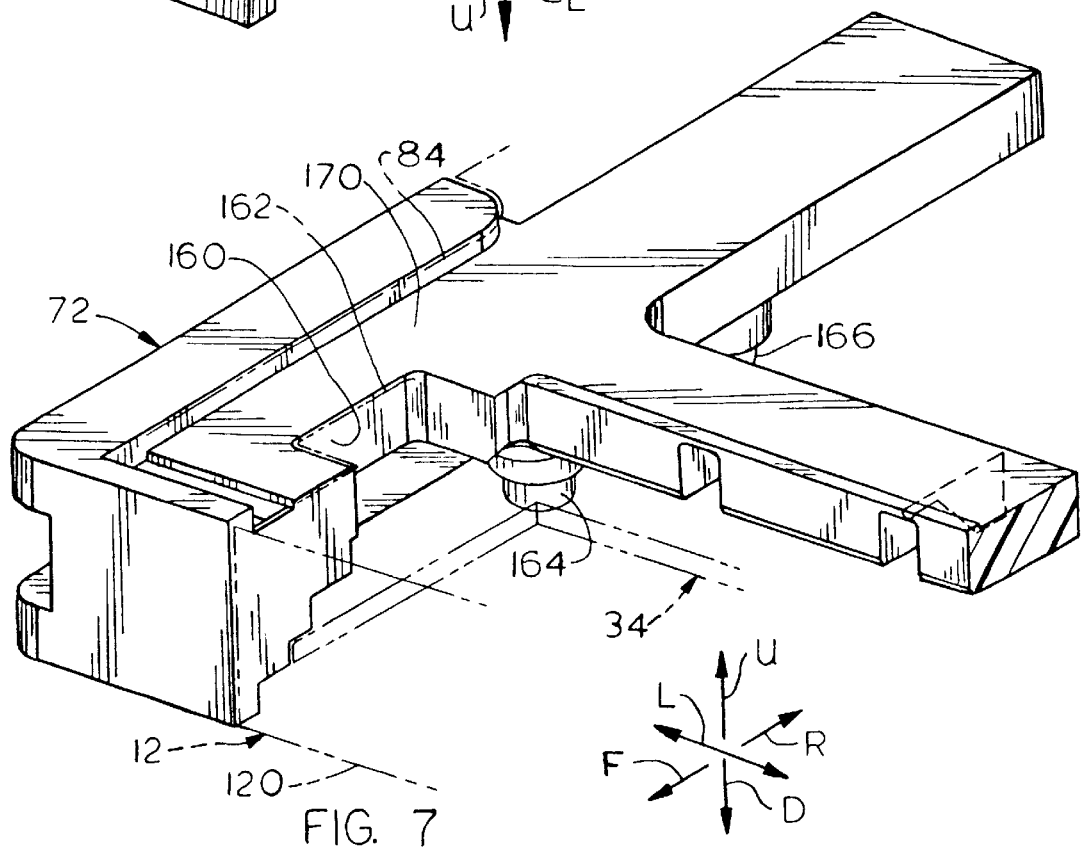
FIG. 7 is a top and front isometric view of a portion of the cardbus bridge of FIG. 4.

As discussed above, the cardbus bridge 70 (FIG. 3) has mounts 72, 74 at its laterally opposite sides. As shown in FIG. 7, each mount such as 72 has a cutout 160 for receiving a corresponding lateral projection 162 at a corresponding side of the housing 120 of the front connector 12. Each mount also includes a pair of pegs 164, 166 that are designed to be received in corresponding holes of the circuit board 34. The mount 72 has an upper surface 170 that is designed to receive a corresponding side 84 of the front of the top cover. The bottom cover part 54 (FIG. 3) has a front end 172 that can rest on the bottom of the front connector housing 120.

FIG. 3 shows that the cardbus bridge 70 is part of a "frameless" connector, wherein only the sheet metal cover 14 and circuit board 34 extend between the cardbus bridge 70 and the rear connector assembly 60. However, some manufacturers of IC cards prefer to provide a molded plastic frame, such as of the construction shown at 180, which includes side beams 182, 184 extending longitudinally (parallel to the directions F, R) to connect mounts such as 72, 74 at the front, to mounts indicated at 190, 192 that can hold a rear connector or be part of a rear connector, or merely hold the rear end of the circuit board. In that case, the cardbus bridge 70 can be part of a one-piece molded frame 180.

Figure 8:
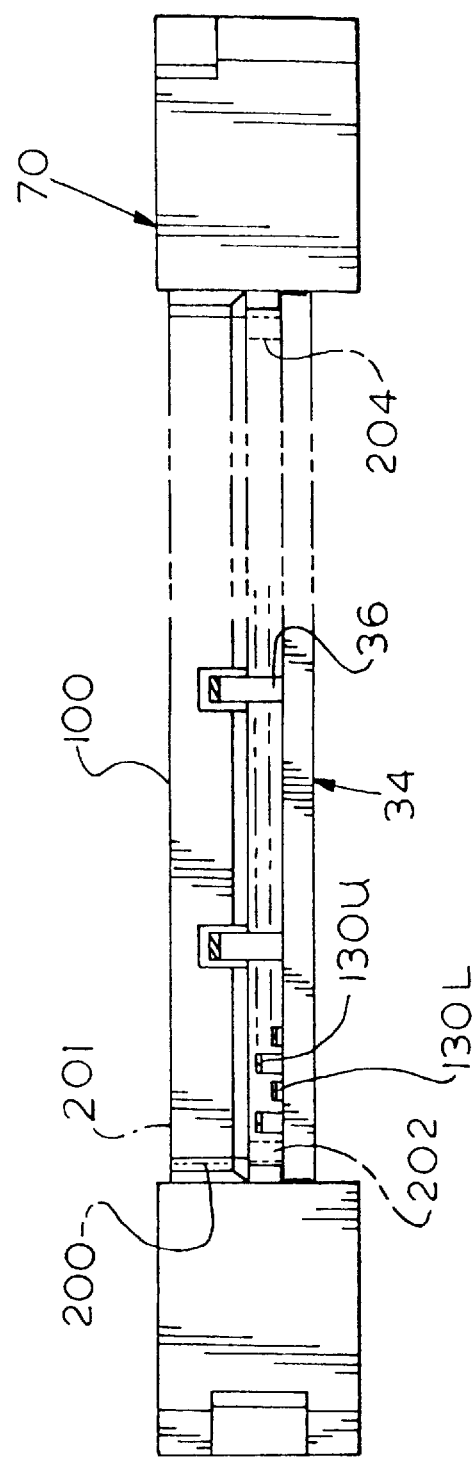
FIG. 8 is a view taken on line 8—8 of FIG. 5, and also showing the circuit board and the shield tails and contact tails.

Although applicant shows the crosspiece 100 being part of a cardbus bridge that has mounts 72, 74 at its laterally opposite sides, it is possible to provide a separate crosspiece 100 without mounts at its laterally opposite sides. FIG. 8 shows, in phantom lines, such a crosspiece 200 which has two end posts 202, 204 that mount on opposite sides of the circuit board 34. Such a crosspiece is also shown in phantom lines in FIG. 5, where the crosspiece 200 is shown as including a center post 206 that is also supported on the circuit board. The crosspiece 200 is coupled to the circuit board by being mounted thereon, and is coupled to the front connector through the circuit board and through an intermediate mount.

While terms such as "top", "bottom", etc. have been used to describe the invention as illustrated, it should be appreciated that the IC card can be used in any orientation with respect to the Earth.

Thus, the invention provides a cardbus bridge with a crosspiece, for supporting the front middle portion of a sheet metal cover part of an IC card. As a result, the cover front edge lies closely behind a shield plate on the front connector, and a gap between the cover front edge and the shield plate rear edge is substantially closed. The crosspiece has an upper surface that supports the front end of the sheet metal cover part to prevent its downward deflection and to separate it from the cardbus shield tails. The crosspiece can have slots for passing shield tails so the front of the crosspiece can have a considerable vertical thickness for greater beam strength and still lie very close to the crossbus shield plate. The crosspiece can have an upward projection at its front end forming a shoulder to locate the front edge of the cover middle portion. The cardbus bridge can include mounts at its laterally opposite sides, on which the front of the circuit board and the front connector are mounted. The cardbus bridge is one piece plastic molded part that is symmetrical about a vertical plane, and can even be part of an entire plastic molded card frame.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card which includes a circuit board having front and rear end portions, said front end portion having a surface with at least one row of signal traces and with at least one secondary ground trace, said IC card also including a front connector comprising a dielectric connector housing having laterally opposite sides and at least one row of contacts mounted in said housing and having contact tails extending at least partially rearwardly therefrom and engaged with said row of signal traces, said IC card also including top and bottom sheet metal cover parts lying respectively above and below said circuit board, comprising:

a cardbus shield that includes a shield plate mounted on said connector housing and lying over said row of contacts, said shield plate having a rear end, and said cardbus shield includes at least one shield tail extending at least partially rearwardly and downwardly from said shield plate and connected to said secondary ground trace;

a dielectric cardbus bridge having a crosspiece lying over portions of said contact tails, said crosspiece forming a top cover support surface, and said top sheet metal cover having a lateral middle with a front end thereof lying rearward of said shield plate and lying on said crosspiece top cover support surface, with said crosspiece supporting said cover middle part front end at a location only slightly rearward of said shield plate rear end.

2. The IC card described in claim 1 wherein:

said crosspiece has a front end forming a largely rearwardly-facing shoulder lying in front of said top cover support surface, and said front of said cover middle part lies substantially against said shoulder.

3. The IC card described in claim 1 wherein:

said front of said cover middle part is bonded to said top cover support surface at a location spaced from the rear end of said shield plate.

4. The IC card described in claim 1 wherein:

said cardbus shield includes a plurality of said shield tails;

said crosspiece has a lower surface and has a plurality of slots in said lower surface, with each of said shield tails extending through one of said slots.

5. The IC card described in claim 1 wherein:

said lateral middle of said top sheet metal part front, has a front edge that lies directly over portions of said contact tails when said circuit board lies in a horizontal plane.

6. The IC card described in claim 1 wherein:

said connector housing has a rear surface (154) from which said contact tails extend, and said contact tails include lower contact tails (130L) that extend a first distance rearward of said housing rear surface and upper contact tails (130U) that extend a greater second distance rearward of said housing rear surface;

said crosspiece has a front edge (150) that lies over portions of both said lower and upper contact tails.

7. The IC card described in claim 1 wherein:

said cardbus bridge has laterally opposite bridge sides forming mounts that are directly connected to said connector housing opposite sides and to said circuit board, and said crosspiece connects and is supported on said mounts.

8. The IC card described in claim 7 wherein:

said front connector housing has laterally opposite sides, and said top cover has a front portion with opposite sides;

said mounts of said cardbus bridge are each fixed to a corresponding side of said front end portion of said circuit board, are each fixed to a corresponding side of said front connector housing, and are each engaged with a corresponding side of the front portion of said top cover.

9. The IC card described in claim 7 wherein:

said IC card includes a molded plastic frame that includes a pair of opposite side beams that extend along a majority of the length of the IC card, with said circuit board mounted on said side beams, and wherein:

said cardbus bridge is integrally molded with said frame.

10. Apparatus for use with an IC card that includes a circuit board having a front end with at least one laterally-extending row of signal traces and with at least one secondary ground trace, a front connector having a dielectric connector housing and at least one row of contacts mounted in said housing and having contact tails engaging said signal traces, a sheet metal cover with a top cover part for lying over the circuit board wherein the top cover part has a middle with a front end, and a cardbus shield having a shield plate lying on said connector housing and connected to said secondary ground trace, comprising:

a cardbus bridge of dielectric molded plastic, said bridge having a crosspiece and having laterally opposite sides with means for coupling to said circuit board;

said cardbus bridge having means for supporting said front end of said top cover middle while preventing said front end of said cover from touching said cardbus shield.

11. The apparatus described in claim 10 wherein:

said cardbus bridge upper surface includes a rear surface portion for supporting said top cover and a front upward projection forming a largely rearwardly-facing shoulder at the front of said rear surface portion for abutting the extreme front end of said cover middle.

12. Apparatus for use with an IC card that includes a circuit board having a front end with at least one laterally-extending row of signal traces and with at least one secondary ground trace, a front connector having a dielectric connector housing and at least one row of contacts mounted in said housing and having contact tails engaging said signal traces, a sheet metal cover with a top cover part for lying over the circuit board wherein the top cover part has a middle with a front end, and a cardbus shield having a shield plate lying on said connector housing and a plurality of shield tails extending from said shield plate to said secondary ground trace, comprising:

a cardbus bridge of molded plastic, said bridge having laterally opposite sides with means for coupling to said circuit board;

said bridge having an upper surface for supporting said front end of said top cover middle, and said cardbus bridge having a lower surface with a plurality of slots therein for passing said shield tails.

* * * * *